United States Patent [19]
Wilhite et al.

[11] Patent Number: 5,553,232
[45] Date of Patent: Sep. 3, 1996

[54] AUTOMATED SAFESTORE STACK GENERATION AND MOVE IN A FAULT TOLERANT CENTRAL PROCESSOR

[75] Inventors: John E. Wilhite; Ronald E. Lange, both of Glendale, Ariz.

[73] Assignee: Bull HN Informations Systems Inc., Billerica, Mass.

[21] Appl. No.: 259,216

[22] Filed: Jun. 13, 1994

[51] Int. Cl.$^6$ ................................................. G06F 11/34
[52] U.S. Cl. ............................................... 395/182.04
[58] Field of Search ................. 371/4, 7; 395/182.04, 395/180, 575

[56] References Cited

U.S. PATENT DOCUMENTS

| | | | |
|---|---|---|---|
| 3,905,023 | 9/1975 | Perpiglia | 340/172.5 |
| 4,823,256 | 4/1989 | Bishop et al. | 364/200 |
| 4,914,576 | 4/1990 | Zelley et al. | 364/200 |

*Primary Examiner*—Robert W. Beausoliel, Jr.
*Assistant Examiner*—Phung My Chung
*Attorney, Agent, or Firm*—James H. Phillips; John S. Solakian

[57] ABSTRACT

In order to gather, store temporarily and efficiently deliver (if needed) safestore information in a fault tolerant central processing unit having data manipulation circuitry including a plurality of software visible registers, a shadow set of the software visible registers are used in conjunction with shadowing and packing circuitry for copying the contents of the software visible registers, after a data manipulation operation, into the shadow set after the validity of such contents have been verified. In the event of a detected fault in a data manipulation operation, the contents of the shadow set, which will be the last valid set immediately before the error was detected, are transferred back to the software visible registers to institute recovery at the point in the data manipulation immediately prior to that at which the error was detected. Preferably, packing circuitry is included to pack half-word (or shorter) register information into full words in the shadow set to minimize the number of shadow registers and support circuitry required. In the preferred embodiment, during the recovery process, the safestore information in the shadow set is routed through a cache memory which is normally in direct contact with the working register set such that minimum special circuitry is necessary to restore the contents of the working registers.

4 Claims, 4 Drawing Sheets

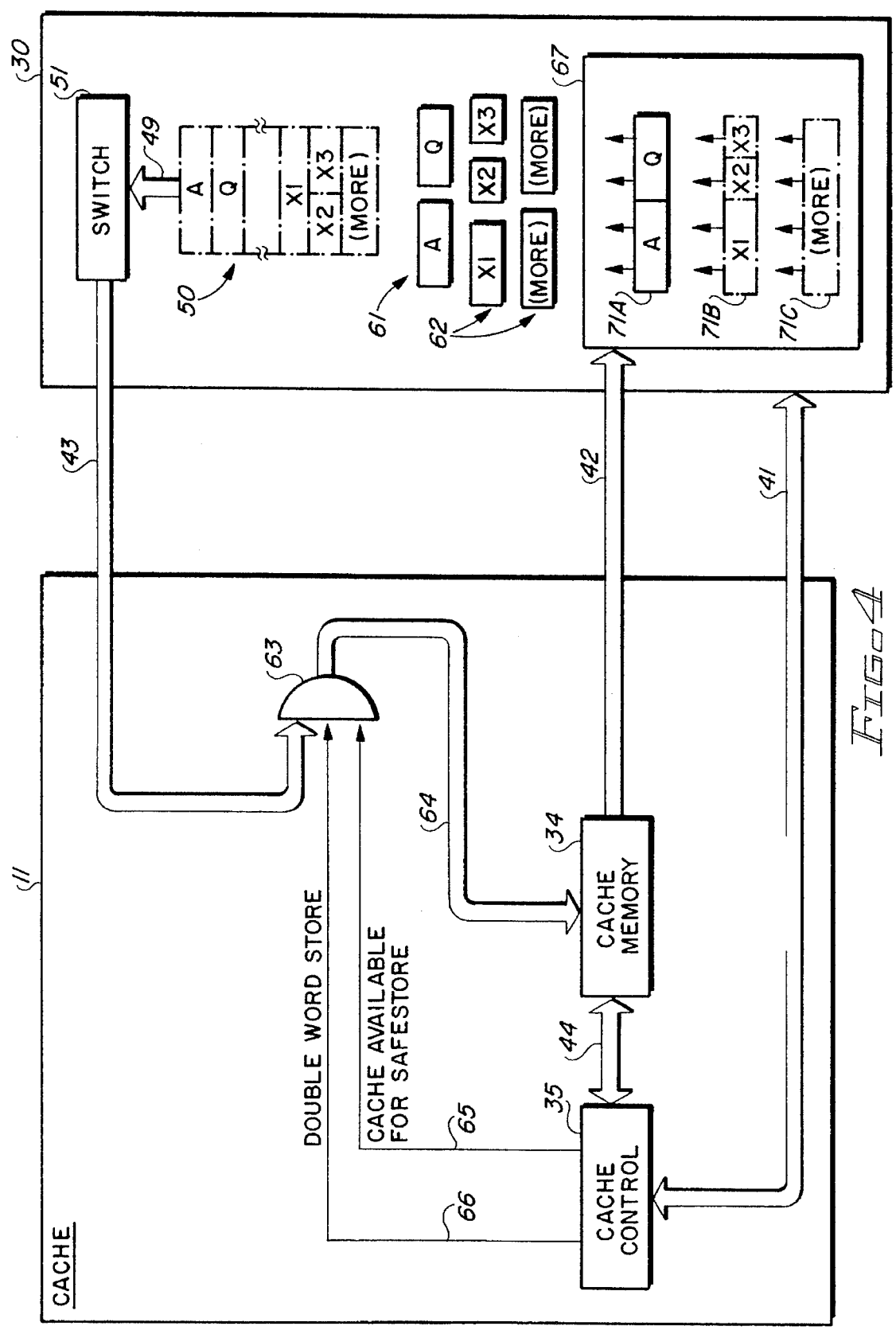

AUTOMATED SAFESTORE STACK GENERATION AND MOVE IN A FAULT TOLERANT CENTRAL PROCESSOR

FIELD OF THE INVENTION

This invention relates to computer central processors and, more particularly, to the repetitive temporary storage of central processing register contents and other information in a safestore in order to facilitate recovery from a fault or transfer to another domain.

BACKGROUND OF THE INVENTION

As personal computers and workstations become more and more powerful, makers of mainframe computers have undertaken to provide features which cannot readily be matched by these smaller machines in order to stay viable in the marketplace. One such feature may be broadly referred to as fault tolerance which means the ability to withstand and promptly recover from hardware faults without the loss of crucial information. The central processing units of mainframe computers typically have error detection circuitry, and sometimes error recovery circuitry, built in at numerous information transfer points in the logic to detect and characterize any fault which might occur.

The CPU(s) of a given mainframe computer comprises many registers logically interconnected to achieve the ability to execute the repertoire of instructions characteristic of the computer. In this environment, the achievement of genuinely fault tolerant operation, in which recovery from a detected fault can be instituted at a point in a program immediately preceding the faulting instruction/operation, requires that one or more recent copies of all the software visible register be maintained and constantly updated. This procedure is typically carried out by reiteratively sending copies of the registers (safestore information) to a special, dedicated memory or memory section. In some CPUs, the safestore information is sent via a result bus during periods when the result bus is not otherwise occupied in order to minimize the number of conductive leads required, an important consideration in the use of smaller and smaller and yet ever more complex integrated circuitry. Sometimes, two safestore memories are provided to receive and temporarily alternately store two recent, but one always more recent, copies of the software visible registers. When a fault occurs and analysis (performed, for example, by a service processor) determines that recovery is possible, the safestore information is used to reestablish the software visible registers in the CPU with the contents held recently before the fault occurred so that restart can be tried from the corresponding place in program execution.

Those skilled in the art are aware of certain drawbacks to the usual provision of safestore capability, which drawbacks directly adversely affect CPU performance. Thus, as higher levels of CPU performance are sought, the performance penalty resulting from the incorporation of safestore techniques to enhance fault tolerance must be more closely considered. The technique discussed above has several drawbacks that adversely affect CPU performance. First, even for the execution of simple instructions during which the safestore operation can be interleaved intermediate other processes which do not use the result bus so as to cause no extra cycle time, some of the registers to be safestored are typically half-word in length and cannot be stored packed into the dedicated memory. As a result, during both the storage process of the safestore information into the dedicated memory (especially, since this is an ongoing procedure) and the recovery of the safestore information (less important since necessary only on fault recovery or a process change), more clock cycles are required to perform each operation.

Additional drawbacks include: 1) The contents of the accumulator and supplementary accumulator registers in a coprocessor may transiently be different than the corresponding registers in the main execution unit, the latter being those conventionally sent to safestore. This requires that the latest copy of these (and perhaps other) registers must be loaded with the latest version as single word stores. 2) Performing the safestore function during the execution of some instructions inherently costs one or two extra cycles, thus making the duration of these instructions correspondingly longer. 3) When the cache is commanded to recover the contents of the safestore information into cache memory in anticipation of a fault recovery/climb, no other cache commands can be executed by the climb during this move time.

While these characteristics are not design errors, their performance penalty is an obstacle to attaining the desired CPU speed level necessary to maintain competitiveness in the market. The subject invention is directed to the alleviation of certain of the limitations mentioned.

OBJECTS OF THE INVENTION

It is therefore a broad object of this invention to provide, in a central processor, fault tolerant operation in which the storage and recovery of safestore information takes place without a performance penalty. It is a more specific object of this invention to provide a fault tolerant central processing unit in which safestore operation is achieved by the implementation of a dedicated shadow set of the software visible registers.

SUMMARY OF THE INVENTION

Briefly, these and other objects of the invention are achieved, in a fault tolerant central processing unit having data manipulation circuitry including a plurality of software visible registers, by providing a shadow set of the software visible registers used in conjunction with shadowing and packing circuitry for copying the contents of the software visible registers, after a data manipulation operation, into the shadow set after the validity of such contents have been verified. In the event of a detected fault in a data manipulation operation, the contents of the shadow set, which will be the last valid set immediately before the error was detected, are transferred back to the software visible registers to institute recovery at the point in the data manipulation immediately prior to that at which the error was detected. Preferably, packing circuitry is included to pack half-word (or shorter) register information into full words in the shadow set to minimize the number of shadow registers and support circuitry required. In the preferred embodiment, during the recovery process, the safestore information in the shadow set is routed through a cache memory which is normally in direct contact with the working register set such that minimum special circuitry is necessary to restore the contents of the working registers.

DESCRIPTION OF THE DRAWING

The subject matter of the invention is particularly pointed out and distinctly claimed in the concluding portion of the specification. The invention, however, both as to organization and method of operation, may best be understood by reference to the following description taken in conjunction with the subjoined claims and the accompanying drawing of which:

FIG. 4 is a simplified block diagram directed to a feature of the invention which is activated during recovery from a fault.

DESCRIPTION OF THE PREFERRED EMBODIMENT(s)

Figure 1:
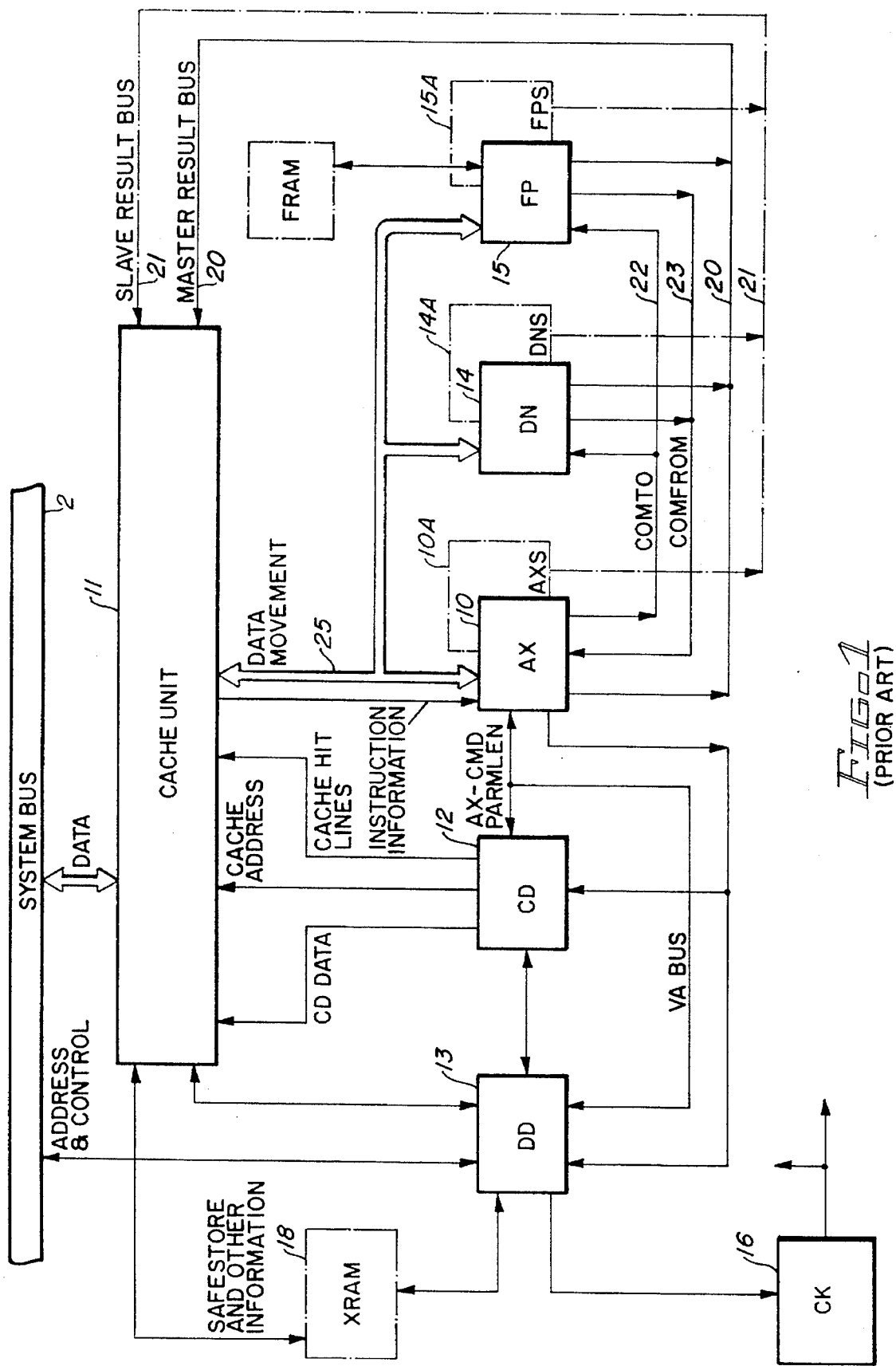
FIG. 1 is a block diagram of a prior art central processing unit of the type in which the subject invention may be employed to obtain improved fault tolerant operation.

Referring to FIG. 1, the Address and Execution Section is a microprocessing engine which performs all address preparation and executes all instructions except decimal arithmetic, binary floating point and multiply/divide instructions. Two identical AX units 10, 10A perform duplicate actions in parallel, and the resulting AX unit outputs are constantly compared to detect errors. The main functions performed by the AX units include:

effective and virtual address formation;

memory access control;

security checks;

register change/use control;

execution of basic instructions, shift instructions, security instructions, character manipulation and miscellaneous instructions.

A cache storage unit 11 stores 64K bytes (16K words). A set associative directory, which defines the main memory location of each 64-byte (16-word) block stored in the cache storage unit, includes a cache directory (CD) unit 12 and a duplicate directory (DD) unit 13.

The specific functions performed by the cache storage unit 11 include:

combined instruction and operand data storage;

instruction and operand buffering and alignment;

data interface with the system bus 7 (FIG. 1);

CLIMB safestore file.

Two copies of the cache directory information are respectively maintained in the CD and DD units which perform different logic functions. The two directory copies allow interrogation of the cache contents from the system bus in parallel and without interference with instruction/operand access from the CPUs and also provide for error recovery. Functions performed by the CD unit 12 include:

cache directory for CPU accesses;

instruction, operand and store buffer management;

virtual-to-real address translation paging buffer.

Functions performed by the DD unit 13 include:

cache directory for system accesses;

system bus control;

distributed connect/interrupt management;

cache directory error recovery.

Efficient scientific calculation capability is implemented on the Floating Point (FP) coprocessor units 15, 15A. The identical FP units execute all binary floating point arithmetic in duplicate. These units, operating in concert with the duplicate AX units 10, 10A, perform scalar or vector scientific processing.

The FP unit 15 (duplicated by the FP unit 15A):

executes all binary and fixed and floating point multiply and divide operations;

computes 12 by 72-bit partial products in one machine cycle;

computes eight quotient bits per divide cycle;

performs modulo 15 residue integrity checks.

Functions performed by the FP units 15, 15A include:

executes all floating point mantissa arithmetic;

executes all exponent operations in either binary or hexadecimal format;

preprocesses operands and postprocesses results for multiply and divide instructions;

provides indicator and status control.

Two special purpose random access memories (FRAM 17 and XRAM 18) are incorporated into the CPU. The FRAM unit 17 is an adjunct to the FP units 15, 15A and functions as an FP control store. The XRAM unit 18 is an adjunct to the AX units 10 10A and serves as a scratchpad as well as providing safestore and patch functions.

The CPU also employs a Clock Distribution (CK) unit 16 whose functions include:

clock distribution to the several units constituting the CPU;

shift path control;

maintenance;

interface between an external Clock and Maintenance Unit and CPU;

provision of clock stop logic for error detection and recovery.

The DN unit 14 (in parallel with the DN unit 14A) performs the execution of decimal numeric Extended Instruction Set (EIS) instructions. It also executes Decimal-to-Binary (DTB), Binary-to-Decimal (BTD) conversion EIS instructions and Move-Numeric-Edit (MVNE) EIS instructions in conjunction with the AX unit 10. The DN unit both receives operands from memory and sends results to main memory (not shown) via the cache storage unit 11.

The AX, DN and FP units, collectively, are sometimes referred to as the Basic Processing Unit (BPU). It was previously noted that the AX, DN and FP units are duplicated with the duplicate units operating in parallel to obtain duplicate results which are available for integrity checking. Thus, master and slave results are obtained in the normal operation of these units. The master results are placed onto a Master Result Bus (MRB) 20 while the slave results are placed onto a Slave Result Bus (SRB) 21. Both the master and slave results are conveyed, on the MRB and SRB respectively, to the cache storage unit 11. In addition, a COMTO ("command to") bus 22 and a COMFROM ("command from") bus 23 couple together the AX unit, the DN unit and the FP unit for certain interrelated operations.

A similar CPU architecture in which, however, the BPUs are peers and operate redundantly, but share the transfer of control signals to the cache unit (in order to limit pin count of the integrated circuit chips used) while still retaining a high degree of data integrity is disclosed in U.S. patent application Ser. No. 08/218,532 entitled CENTRAL PROCESSOR WITH DUPLICATE BASIC PROCESSING UNITS EMPLOYING MULTIPLEXED CACHE STORE CONTROL SIGNALS TO REDUCE INTER-UNIT CONDUCTOR COUNT by William A. Shelly et al, assigned to the same assignee as the present application and incorporated herein to the extent relevant. While the present invention is presently incorporated into a CPU having duplicate BPUs, two BPUs are not required such that the following discussion is clarified by illustrating and discussing only a single BPU.

Figure 2:
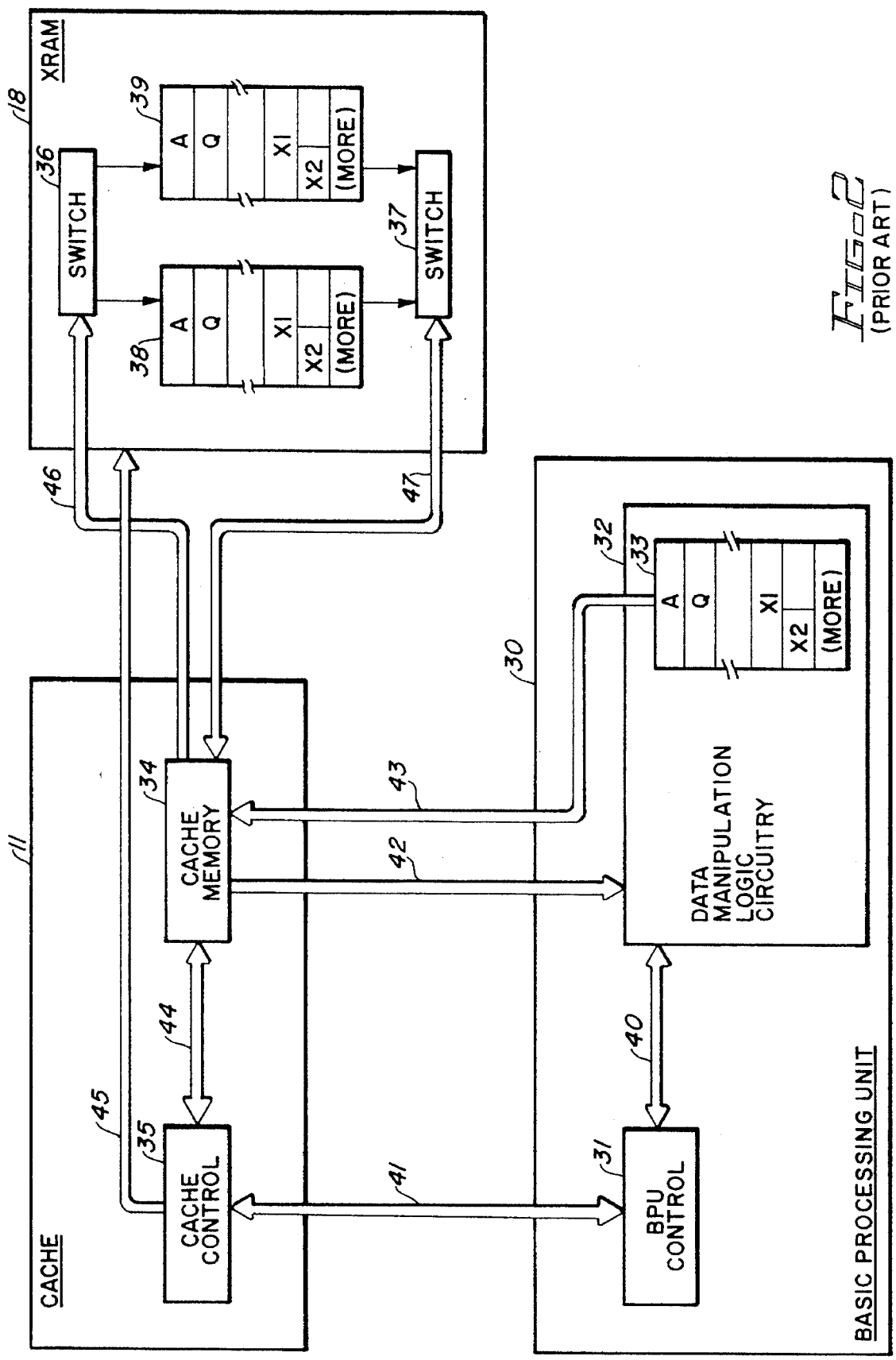
FIG. 2 is a simplified block diagram of the central processing unit of FIG. 1 more particularly illustrating a prior art configuration for saving and recovering safestore information.

Referring now to FIG. 2, there is shown a simplified block diagram of the central processing unit of FIG. 1 illustrating more particularly a prior art configuration for saving and recovering safestore information. The BPU 30 includes a data manipulation logic circuitry block 32 operating under the control of B PU control block 31 via local control and status lines 40. The data manipulation logic circuitry block 32 accepts instruction information and data information to be processed from a cache memory 34 in the cache unit 11 via bus 42, processes the information according to the instruction sequence, and periodically sends result information to the cache memory via result bus 43, all in the conventional manner. Coordination between the BPU 30 and the cache unit 11 is achieved by the exchange of control and status signals between the BPU control block 31 and the cache control block 35 via bus 41. The cache control block 35 also exchanges control and status signals with the cache memory 34 via local control and status lines 44.

The data manipulation logic circuitry includes numerous registers, represented by register block 33, which are logically interconnected to achieve the repertoire of possible data manipulation operations. Typically, in the exemplary CPU, the final results of a given operation are placed in "A" (accumulator) and "Q" (supplementary accumulator) registers and periodically transmitted to the cache memory 34 via the result bus 43 as two 40-bit words (thirty-six data bits and four parity bits).

However, this transmission of results occurs only intermediate relatively long sequences of processing during which the result bus 43 is available for other uses. Therefore, it is possible to use the result bus intermediate the transfer of results to transfer the current state of the register set 33 as safestore information to the XRAM 18 via the cache unit 11. In practice, this operation is typically carried out during a cache read operation during which information is transferred from the cache memory 34 to the data manipulation logic circuitry 32 on the bus 42 and the result bus 43 is available for such use.

The safestore information is transferred, in the first available period during which the cache memory 34 is not sending information to or receiving information from the data manipulation logic circuitry or is otherwise occupied, to the XRAM 18 via bus 46 where it is received by input switch 36 which alternately directs the safestore information to safestore buffer 38 and safestore buffer 39. In this manner, a very recent version and a recently preceding version of the register set 33 is always mirrored in safestore.

In the event of the occurrence of a fault from which recovery has been determined to be possible (as by a service processor, not shown), processing may be restarted at a point just prior to the fault by transferring the most recent register set stored in the safestore buffers 38, 39 back to the cache memory 34 via output switch 37 and bus 47 and thence to the data manipulation logic circuitry 32 via bus 42 to reestablish the register set 33.

As higher levels of CPU performance are sought, the performance penalty resulting from the incorporation of safestore techniques to enhance fault tolerance must be more closely considered. The technique illustrated in FIG. 2 has several drawbacks that adversely affect CPU performance. First, even for the execution of simple instructions during which the safestore operation can be interleaved intermediate other processes which do not use the result bus so as to cause no extra cycle time, some of the registers to be safestored (e.g., a series of X-registers in the exemplary system) are half-word (eighteen bits in the example) in length and cannot be stored packed into the XRAM. In FIG. 2, this characteristic is represented by the half-word X2 register. Those skilled in the art will appreciate that, in both the storage process of the safestore information into the XRAM 18 (especially, since this is an ongoing procedure) and the recovery of the safestore information, more clock cycles are required to perform the operation.

Additional drawbacks include: 1) The state of the A and Q registers in the FP unit may transiently be different than the A and Q registers in the AX unit, the latter being those sent to safestore. This requires that the latest copy of the A/Q/X-registers must be loaded with the latest version as single word stores. 2) Performing the safestore function during the execution of some instructions inherently costs one or two extra cycles, thus making the duration of these instructions correspondingly longer. 3) When the cache unit is commanded to recover the contents of the safestore into cache memory in anticipation of a fault recovery/climb, no other cache commands can be executed by the climb during this move time.

Figure 3:
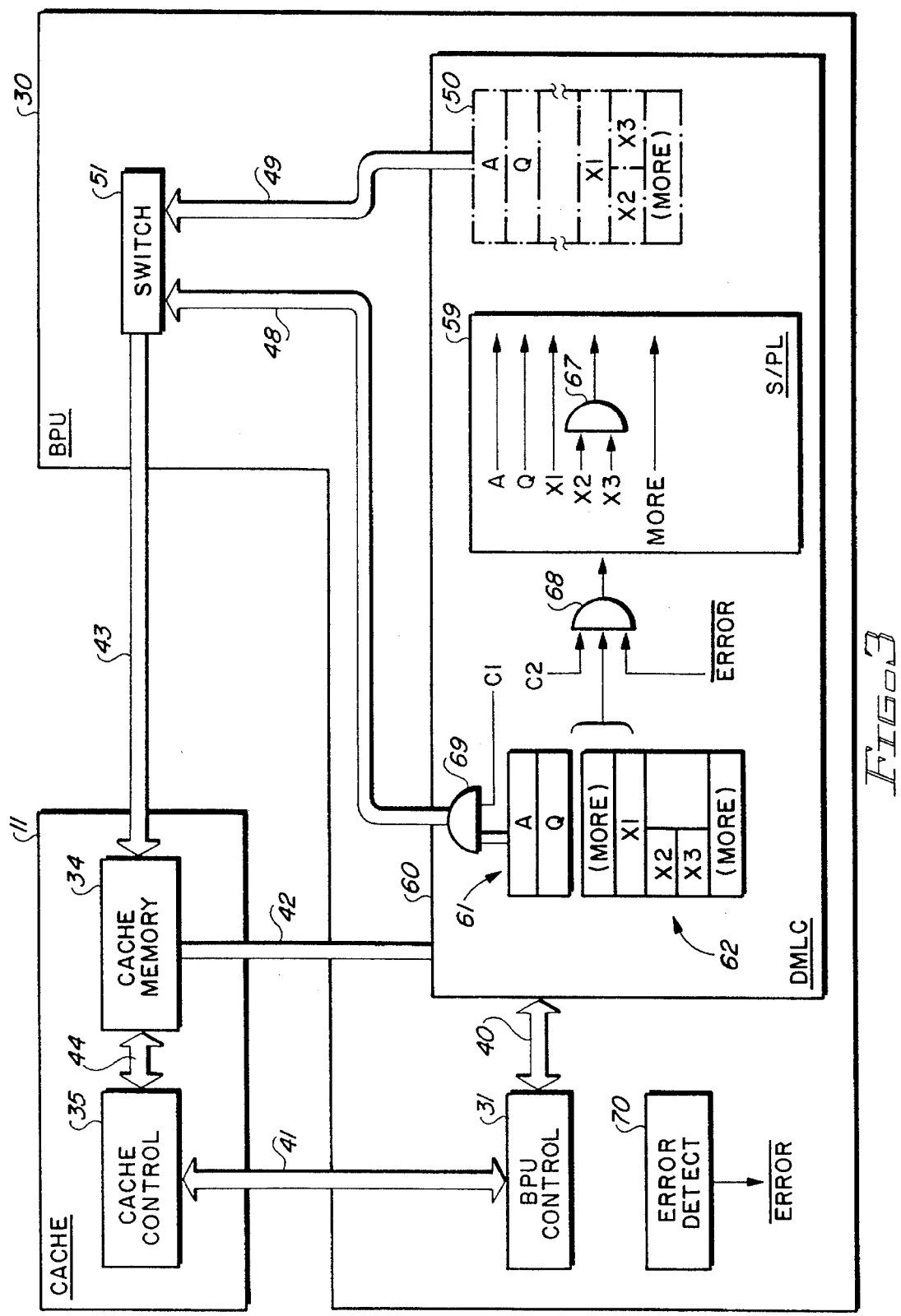
FIG. 3 is a simplified block diagram of a central processing unit illustrating a revised configuration according to the subject invention for saving and recovering safestore information.

While these characteristics are not design errors, their performance penalty is an obstacle to attaining the desired CPU speed level necessary to maintain competitiveness in the market. Thus, attention is now directed to FIG. 3 which illustrates a logic structure in which certain of the limitations mentioned above are overcome.

The data manipulation block 60 includes additional circuitry over that included in the corresponding block 32 in FIG. 2. The results of data manipulation operations placed in the A/Q registers 61 are, at the conclusion of the execution of an instruction, transferred to the result bus 43, via AND-gate array 69, internal bus 48 and switch 51, and placed in the cache memory 34 in the normal manner. The other software visible registers, represented by the block 62, along with the A/Q registers 61, are also mirrored, in packed form, in shadow register bank 50. The shadow register bank 50 is updated from the software visible registers 61, 62 via AND-gate array 68 and shadowing and packing logic 59 which serve to track the contents of the software visible registers and to combine half-word registers, such as X2 and X3, as by AND-gate array 67, to pack the shadow register bank 50.

It will be observed that the result information is clocked through the AND-gate array 69 by a first clock pulse C1 whereas the software visible register information is clocked to the shadowing and packing logic 59 through the AND-gate array 68 by a second clock pulse C2. It will be understood that C1 precedes C2 in time in order that the software visible register information from the register sets 61, 62 can be assumed to be valid. That is, by the time C2 is present, the data manipulation logic for a just completed step will have concluded without an error having been detected. If, however, an error has been detected, the error bar signal from error detect logic 70 will not be true resulting in the disabling of the AND-gate array 68, thereby insuring the validity of the information most recently transferred into the shadow register bank 50. Error detect logic 70 may be of the more or less conventional type as disclosed, by way of example only, in U.S. Pat. 5,276,862 entitled SAFESTORE FRAME IMPLEMENTATION IN A CENTRAL PROCESSOR by Lowell D. McCulley et al, assigned to the same assignee as the present application and incorporated herein to the extent relevant. Briefly, the error detect logic 70 monitors various operations within the central processing unit and issues a signal (error bar false in the example) when an error occurs which renders invalid (i.e., untrustworthy) the current contents of one or more of the software visible registers 61, 62.

Thus, the most up-to-date valid version of each register mirrored in the shadow register bank 50 is always present therein. When restarting after a recoverable fault, this fully valid safestore information is read from the shadow register bank 50 via switch 51, result bus 43, cache memory 34 and bus 42 to the set of software visible registers 61, 62 for the restart.

Referring now to FIG. 4, it will be observed that the recovery of the safestore information into the cache memory 34 takes place through a gate array 63 which is only enabled, by a signal from the cache control 35 to the gate array 63 via control line 65, when the cache memory is available; i.e., is not occupied by other critical activities during the climb or fault recovery. In addition, unlike the prior art safestore illustrated in FIG. 2, the safestore information recovery is enabled, by a signal from the cache control 35 to the gate array 63 via control line 66, to take place as double word stores to substantially increase the speed of recovery of the safestore information.

At an opportune time, as determined by the coordination between the cache control 35 and the BPU control 31 (FIG. 3) via bus 41, the safestore information is transferred back into the working registers 61, 62 via bus 42 and unpacking and distribution logic block 67. In unpacking and distribution logic block 67, each half-word of each received double word can be routed independently to a destination working register. Thus, a first received double word, represented at 71A, might contain the A and Q safestore information, with the appropriate two half-words routed to each by conventional steering logic. Similarly, a second received double word, represented at 71B, might contain the full word X1 safestore information and also the half-word each X2 and X3 safestore information with the appropriate two half-words routed to X1 and the appropriate single half-words routed to each of X2 and X3. The remaining safestore information, represented as "MORE" at 71C, are similarly received, unpacked and distributed until all the working registers have had valid safestore information restored such that processing can be restated at a point just preceeding that at which the faulting operation took place.

Thus, while the principles of the invention have now been made clear in an illustrative embodiment, there will be immediately obvious to those skilled in the art many modifications of structure, arrangements, proportions, the elements, materials, and components, used in the practice of the invention which are particularly adapted for specific environments and operating requirements without departing from those principles.

What is claimed is:

1. A fault tolerant central processing unit comprising:

A) data manipulation circuitry including a plurality of software visible registers, each said software visible register temporarily storing information contents as data is manipulated by said data manipulation circuitry;

B) a shadow set of said software visible registers;

C) shadowing, packing and validity verification means coupled intermediate said software visible registers and said shadow set for copying the information contents of said plurality of software visible registers, after a data manipulation operation, into said shadow set after the validity of such contents have been verified, said shadowing, packing and validity verification means including combining means for packing information from at least two of said software visible registers, each of which do not exceed half word length, into a single word constituent in said shadow set: and D) resumption of activity means coupled intermediate said shadow set and said software visible registers for replicating the contents of said shadow set in said software visible registers during recovery from a detected fault.

2. The fault tolerant central processing unit of claim 1 in which said validity verification means further includes:

A) error detect means for sensing an occurence of an error which renders invalid the contents of at least one of said software visible registers at the time said error is detected and for issuing an error signal indicating such error occurrence; and B) inhibiting means responsive to the issuance of said error signal to prevent shadowing said plurality of software visible registers into said shadow set.

3. The fault tolerant central processing unit of claim 2 in which said resumption of activity means further includes a cache memory, the contents of said shadow set being transferred to said software visible registers via said cache memory during recovery from a detected fault.

4. The fault tolerant central processing unit of claim 1 in which said resumption of activity means further includes a cache memory, the contents of said shadow set being transferred to said software visible registers via said cache memory during recovery from a detected fault.

* * * * *